United States Patent
Meyers et al.

(10) Patent No.: US 6,768,442 B2
(45) Date of Patent: Jul. 27, 2004

(54) ADVANCED DIGITAL ANTENNA MODULE

(75) Inventors: Clifford W. Meyers, Rancho Palos Verdes, CA (US); Lloyd F. Linder, Agoura Hills, CA (US); Kenneth A. Essenwanger, Walnut, CA (US); Don C. Devendorf, Carlsbad, CA (US); Erick M. Hirata, Torrance, CA (US); William W. Cheng, Redondo Beach, CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 10/280,680

(22) Filed: Oct. 25, 2002

(65) Prior Publication Data

US 2004/0080444 A1 Apr. 29, 2004

(51) Int. Cl.[7] .............................................. H03M 1/36
(52) U.S. Cl. ......................... 341/158; 341/159; 327/65; 327/89
(58) Field of Search .............................. 327/57, 65, 89; 341/155, 158, 159

(56) References Cited

U.S. PATENT DOCUMENTS

| | | | | |
|---|---|---|---|---|
| 4,752,766 A | * | 6/1988 | Shimizu et al. | 341/159 |
| 4,771,188 A | * | 9/1988 | Cheng et al. | 327/60 |
| 5,392,045 A | * | 2/1995 | Yee | 341/156 |
| 6,426,714 B1 | * | 7/2002 | Ruha et al. | 341/155 |
| 6,597,303 B2 | * | 7/2003 | Cosand | 341/155 |
| 2002/0175716 A1 | * | 11/2002 | Cyrusian | 327/108 |

* cited by examiner

Primary Examiner—Howard L. Williams
(74) Attorney, Agent, or Firm—Leonard A. Alkov; Glenn H. Lenzen, Jr.

(57) ABSTRACT

An Advanced Digital Antenna Module (ADAM) for receiving and exciting electromagnetic signals. The ADAM ASIC integrates a complete receiver/exciter function on a monolithic SiGe device, enabling direct digital-to-RF (Radio Frequency) and RF-to-digital transformations. The invention includes an improved analog-to-digital converter (ADC) (10) with a novel active offset method for comparators. The novel ADC architecture (10) includes a first circuit (12, 14) for receiving an input signal; a second circuit (18) for setting a predetermined number of thresholds using a predetermined number of preamplifiers (60) with weighted unit current sources (66) in each of the preamplifier outputs; and a third circuit (20) for comparing the input to the thresholds. In the preferred embodiment, the ADC (10) includes trimmable current sources (66). The ADC (10) of the present invention also includes an improved comparator circuit (62). The novel comparator (62) includes split load resistors, pairs R25 (active mode) and R26 and pairs R24 (active mode) and R49, to increase the acquisition time and reduce the regeneration time constant, emitter follower buffers Q85 and Q87 on the latch pair transistors Q61 and Q62 to reduce the capacitive loading on the regeneration node, and cascode transistors Q64 and Q119 coupled to the load resistors to eliminate the output loading effects from the regeneration node. In the preferred embodiment, the invention also includes a novel DDS/DAC architecture (200) with digitally trimmed unary currents and a novel sine lookup and decoder design which overcomes the conventional dynamic range limitations at high conversion rates.

33 Claims, 12 Drawing Sheets

ADVANCED DIGITAL ANTENNA MODULE

BACKGROUND OF THE INVENTION

1. Field of the Invention

The present invention relates to electromagnetic communications systems. More specifically, the present invention relates to direct digital synthesis (DDS) and direct digitization of radio frequency (RF) signals.

2. Description of the Related Art

For current and future applications, space based radars will require high performance at lightweight and small volume. For example, by the year 2008, such systems will be expected to handle multiple tasks such as Synthetic Aperture Radar (SAR), Ground Moving Target Indication (GMTI), Airborne Moving Target Indication (AMTI), Digital Terrain Elevation Detection (DTED), and other multi-intelligence (INT) functions. Current systems tend to be stove piped, narrowly focused and single functioned. In addition, payloads for these systems will be required to have weight densities on the order of 4 kg per square meter (3 times lighter than today's systems) and volume compaction of about 1500:1 (typical compaction ratios are currently between 3 and 5 to 1). Potential customers have also stressed a need for all of these improvements at a lower cost than can be achieved today (in light of shrinking budgets).

Current space based radar systems incorporate consolidated receivers and exciters. These solutions are adequate for systems that do not require large numbers of independent phase centers (typically less than 8), do not need to perform multi-INT missions, do not need to weigh less than 12 Kg per square meter, do not need ultra-wide bandwidths, etc. Furthermore, current solutions for today's receiver functions tend to cost about $1M per channel (for space qualified hardware) which would be unacceptable for systems requiring over 32 independent receivers for example. Thus, current hardware is expensive, bulky, heavy, relatively specialized and not suitable to meet tomorrow's needs.

Hence, a need exists in the art for an improved system or method for receiving and exciting electromagnetic signals which is smaller, lighter, and less expensive than current systems.

SUMMARY OF THE INVENTION

The need in the art is addressed by the novel analog-to-digital converter (ADC) and direct digital synthesizer (DDS) architectures of the present invention. The novel ADC architecture includes a first circuit for receiving an input signal; a second circuit for setting a predetermined number of thresholds using a predetermined number of preamplifiers with weighted unit current sources in each of the preamplifier outputs; and a third circuit for comparing the input to the thresholds. The novel active offset method of the present invention removes the R-C time constant associated with the resistive ladder of conventional ADCs and provides the ability to easily trim individual thresholds without the need for trimmable resistors. In the preferred embodiment, the ADC includes trimmable current sources.

In the best mode, the ADC of the present invention incorporates an improved comparator circuit. The novel comparator includes split load resistors to increase the acquisition time and reduce the regeneration time constant, emitter follower buffers on the latch pair transistors to reduce the capacitive loading on the regeneration node, and cascode transistors coupled to the load resistors to eliminate the output loading effects from the regeneration node. All of these improvements allow a faster acquisition time and regeneration time constant to be on the order of the forward transit time in the transistor, which is a theoretical limit.

When implemented as an Advanced Digital Antenna Module (ADAM) for receiving and exciting electromagnetic signals, the ADAM Application Specific Integrated Circuit (ASIC) may integrate a complete receiver/exciter function on a monolithic silicon germanium (SiGe) device, enabling direct digital-to-RF (Radio Frequency) and RF-to-digital transformations. Thus, the teachings disclosed herein provide for improved analog-to-digital converter (ADC) operation via a novel active offset comparison methodology.

The novel DDS architecture overcomes the existing accuracy and dynamic limitations of digital-to-analog converter (DAC) structures through the ability to digitally trim out differential nonlinearities of the converter. Additionally, digital algorithms are implemented which address the limitations that transistor self-heating has had on converter dynamic range.

BRIEF DESCRIPTION OF THE DRAWINGS

FIG. 2b shows an offset current source for the preamplifier in FIG. 2a.

FIG. 2c shows an offset current source with linearity trim for the preamplifier in FIG. 2a.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The present invention is an Advanced Digital Antenna Module (ADAM) which integrates a complete receiver/exciter function on a monolithic SiGe device, enabling direct digital-to-RF (Radio Frequency) and RF-to-digital transformations. The receive function includes an improved flash analog-to-digital converter (ADC) with a novel active offset method and an improved high-speed comparator.

Figure 1:
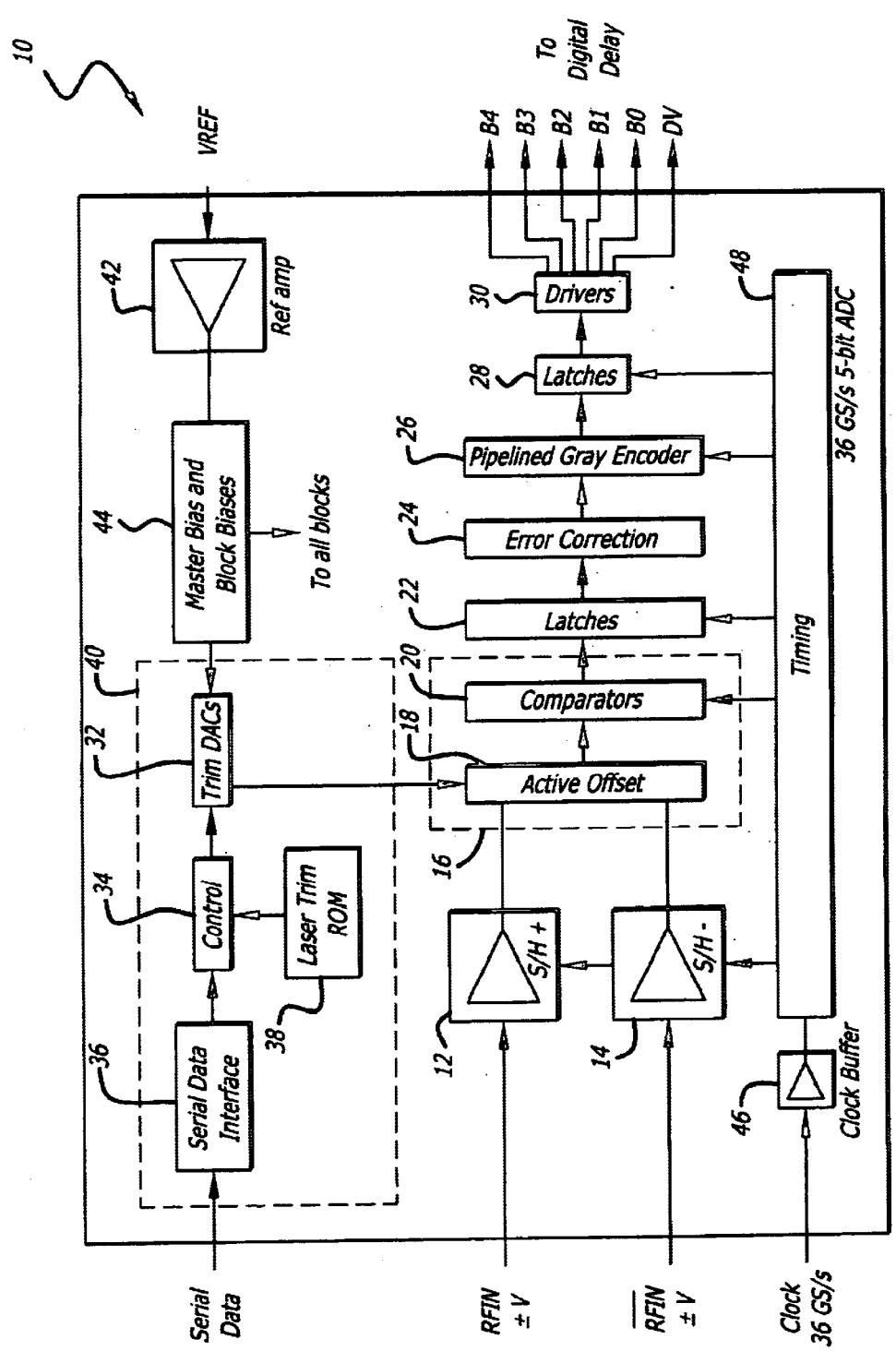
FIG. 1 is a block diagram of an analog-to-digital converter designed in accordance with the teachings of the present invention.

The receiver section of the ADAM ASIC consists of a 5-bit flash ADC 10 followed by a true digital time delay with 28 ps resolution, a digital filter and decimation section 80, and a set of drivers for laser modulators. FIG. 1 is a block diagram of the ADC 10. As shown, the ADC 10 has a differential input using two single-ended sample and hold (S/H) circuits 12 and 14. Each sampler has a wide input bandwidth to minimize gain roll-off over the desired frequency range. In the preferred embodiment, an improved diode bridge sampling gate architecture is used to achieve this performance.

The 5-bit ADC 10 uses an advanced front-end architecture 16 to achieve the high input bandwidth. The front-end architecture 16 includes an active offset block 18 and a comparators block 20. The novel active offset technique splits the signal into $2^N-1$ separate signal levels that are sampled by $2^N-1$ high-speed comparators, where N is the number of bits. In the preferred embodiment, N=5, resulting in 31 comparators. It eliminates the passive reference resistor ladder skew and the bandwidth limitations that exist in older straight flash and folding/interpolating architectures. An improved high-speed comparator architecture achieves the required acquisition time and regeneration time necessary to meet the clock conversion rate.

An optional latch 22 and error correction 24 following the comparators 20 is inserted to reduce the bit error rate (BER). Following the error correction 24, a pipelined gray encoder 26 is implemented instead of a binary encoder to minimize code dependent errors. Latches 28 and drivers 30 follow the gray encoder 26, and the output is sent to a digital delay, matched filter and decimation circuit 80 (shown in FIG. 8).

In the illustrative embodiment, the ADC 10 of the present invention further includes a linearity trim circuit 40 for minimizing differential and integral DC errors in the comparator threshold paths. In the preferred embodiment, the linearity trim circuit 40 includes trimmable digital-to-analog converters 32. A control 34 externally controls the calibration DACs 32 through a digital serial interface (DSI) 36 and an on-chip laser link ROM 38. In the preferred embodiment, the digital serial interface 36 is implemented in complementary metal oxide semiconductor (CMOS). The invention, however, is not limited to CMOS technology.

The ADC 10 also includes an amplifier 42 that amplifies a reference signal VREF and sends it to a Master Bias and Block Biases circuit 44. The Master Bias and Block Biases circuit 44 provides the bias signals required by the other blocks. The ADC 10 also includes a Clock Buffer 46 and Timing Circuit 48 which supplies a clock signal to the circuit blocks.

The improved flash ADC 10 includes a differential quantizer with a novel active offset method for comparators. For a typical N-bit flash ADC, there are $2^N-1$ thresholds or quantization or Q levels. Each of the $2^N-1$ thresholds is set by zero-crossings at one of the $2^N-1$ comparator inputs. The input signal is compared to each of these thresholds simultaneously and encoded into a digital word depending on where the signal was compared to each $2^N-1$ comparator references.

Previous ADCs have been designed either with a single ended input and $2^N-1$ comparator references set by a static resistor divider ladder, or differential inputs with a dynamic differential series resistor ladder. The single-ended approach has a disadvantage because it is difficult to handle common mode voltage variations. The differential input ladder, however, is slower because of the R-C time constant of the input through the series resistor ladder. The novel approach of the present invention eliminates the R-C problem while still maintaining a differential input.

Figure 2A:
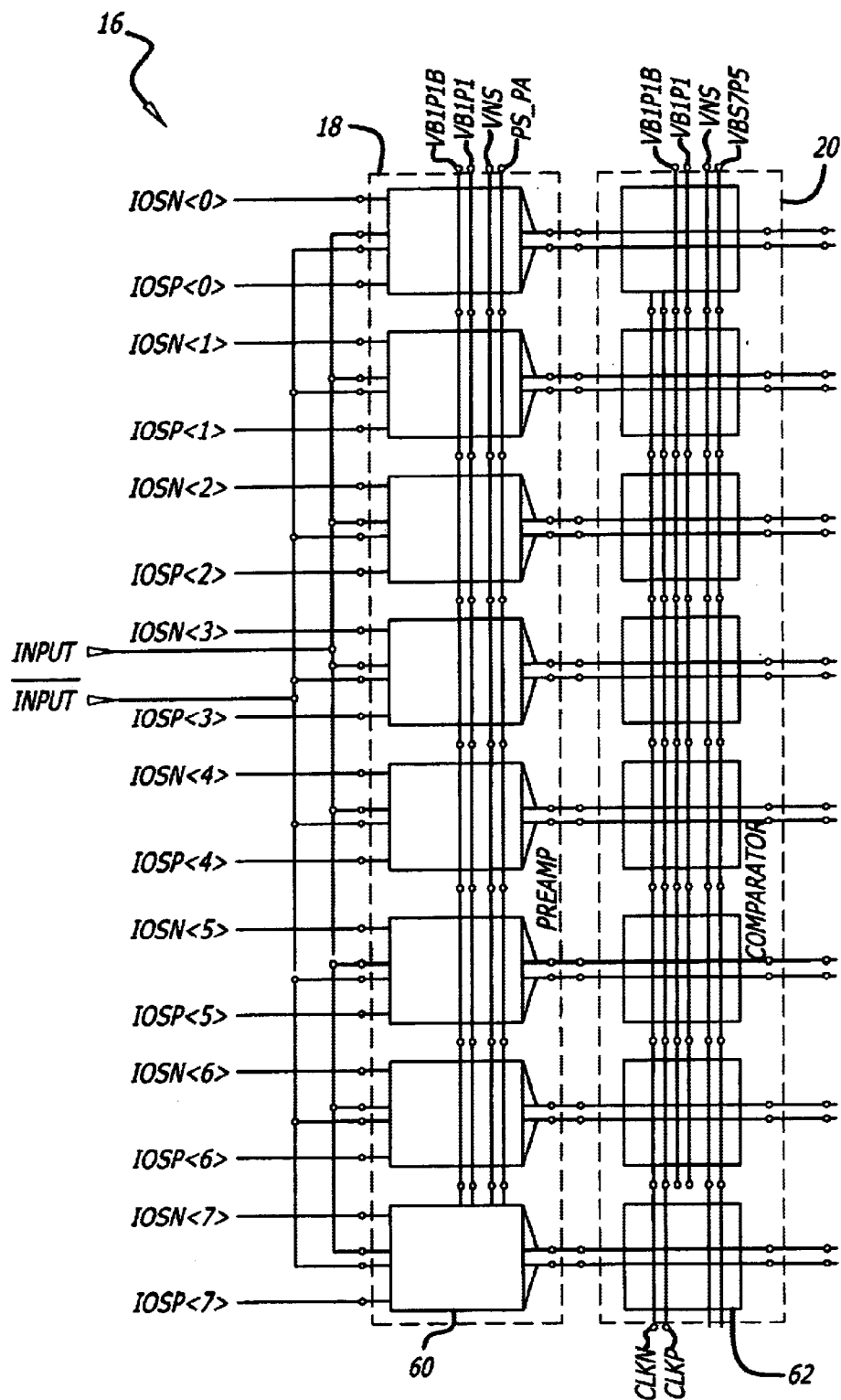
FIG. 2a shows the front-end architecture for a 3-bit ADC.
Figure 2B:
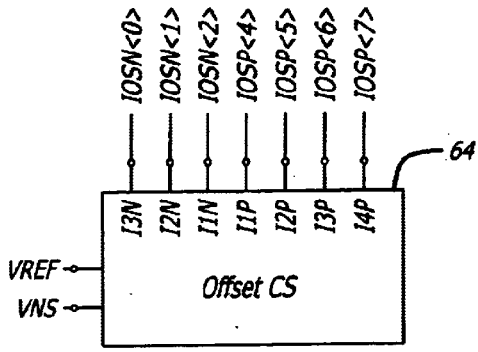
Figure 2C:
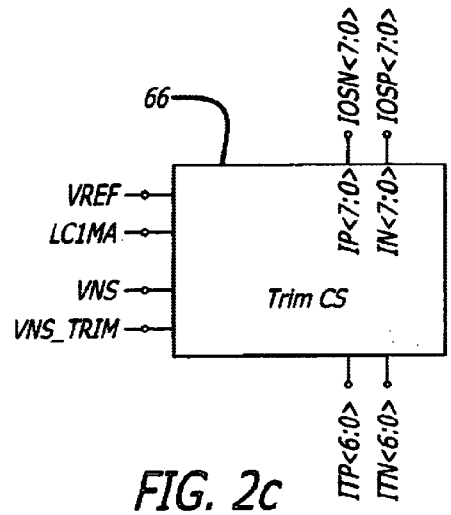

FIG. 2a shows the front-end architecture 16 for a 3-bit ADC with 8 preamplifiers and comparators (1 for saturation detection). The differential input resistor is eliminated from both inputs and the differential signal connects to the inputs of $2^N-1$ preamplifiers 60 in parallel. The thresholds are set by weighted unit offset current sources 64 or 66 (shown in FIGS. 2b and 2c) in each of the $2^N-1$ preamplifier outputs, which divided by the preamplifier gain effectively puts a different zero-crossing at each input. FIG. 2b shows an offset current source 64, and FIG. 2c shows an offset current source with linearity trim 66. Therefore, as the input signal changes, the output of each preamplifier 60 has a different zero-crossing threshold. The preamplifier outputs drive one comparator 62 each, and the signal is then digitally encoded based upon where the signal is relative to the preamplifier output states.

The novel active offset method of the present invention will allow higher bandwidths to the ADC while still maintaining a differential signal. To achieve high input bandwidths in an ADC, a single ended input with dc references is more desirable than a differential input with differential series resistor ladders that set the reference levels. This invention maintains the differential input but eliminates the need for a series resistor ladder to generate the different thresholds for the comparators. Instead, a dc offset is induced at the output of every $2^N-1$ preamplifier.

Figure 3:
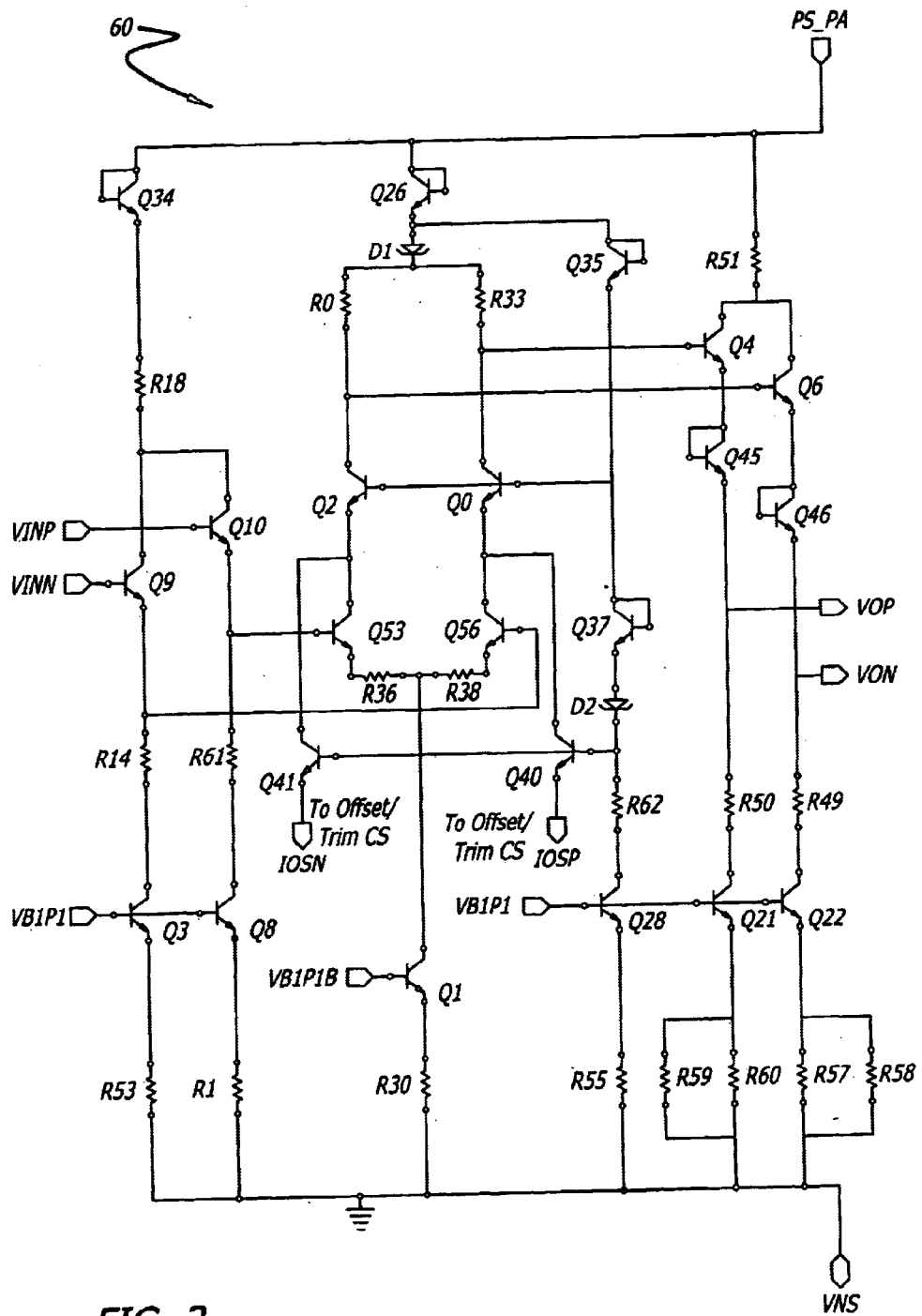
FIG. 3 is a diagram of a preamplifier designed in accordance with the teachings of the present invention.

FIG. 3 is a diagram of a preamplifier 60 designed in accordance with the teachings of the present invention. The differential inputs VINP and VINN are input to the bases of transistors Q10 and Q9, respectively. The collectors of Q10 and Q9 are connected to the emitter of Q34 by a resistor R18. The base and collector of Q34 are connected to a bias signal PS_PA. The emitter of Q9 is connected to the base of Q56 and to the collector of Q3 by a resistor R14. The emitter of Q10 is connected to the base of Q53 and to the collector of Q8 by a resistor R61. The bases of Q3 and Q8 are connected to bias signal VB1P1 and the emitters are connected to VNS by resistors R53 and R1, respectively. The emitters of Q53 and Q56 are connected to the collector of Q1 by resistors R36 and R38, respectively. The base of Q1 is connected to VB1P1B and the emitter is connected to VNS by resistor R30. The collector of Q53 is connected to the collector of Q41 and the emitter of Q2. The emitter of Q41 is connected to a signal IOSN supplied by an offset or trim current source 64 or 66. The collector of Q56 is connected to the collector of Q40 and the emitter of Q0. The emitter of Q40 is connected to a signal IOSP supplied by an offset or trim current source. The collector of Q2 is connected to the base of Q6, and to the emitter of Q26 by a resistor R0 and diode D1. In the preferred embodiment, the diode D1 is a Schottky diode. The invention, however, is not limited to the use of Schottky diodes. Any diode, including a transistor in a diode connection, can be used. The collector of Q0 is connected to the base of Q4, and to the emitter of Q26 by a resistor R33 and diode D1. The base and collector of Q26 are connected to PS_PA. The collectors of Q4 and Q6 are connected to PS_PA by a resistor R51. The emitter of Q4 is connected to the base and collector of Q45. The emitter of Q6 is connected to the base and collector of Q46. The emitters of Q45 and Q46 are connected to VOP and VON, respectively. The bases of Q0 and Q2 are connected to the emitter of Q35 and the collector and base of Q37. The base and collector of Q35 are connected to the emitter of Q26. The emitter of Q37 is connected to a diode D2 followed by a resistor R62 connected to the collector of Q28. The bases of Q40 and Q41 are connected to the collector of Q28 by R62. The emitter of Q28 is connected to VNS by R55. The bases of Q28, Q21, and Q22 are connected to VB1P1. The emitter of Q21 is connected to VNS by parallel resistors R59 and R60. The emitter of Q22 is connected to VNS by parallel resistors R57 and R58. The collector of Q21 is connected to VOP by R50 and the collector of Q22 is connected to VON by R49.

The output of each preamplifier is offset by a different offset current (IOSN and IOSP) in the load resistor of the preamplifier. The preamplifier outputs (zero-crossing thresholds) are offset by −3IR, −2IR, −IR, 0, +IR, +2IR, +3IR, and +4IR for saturation. R is the preamplifier load resistor R0 or R33, and I is the unit offset current.

Figure 4:
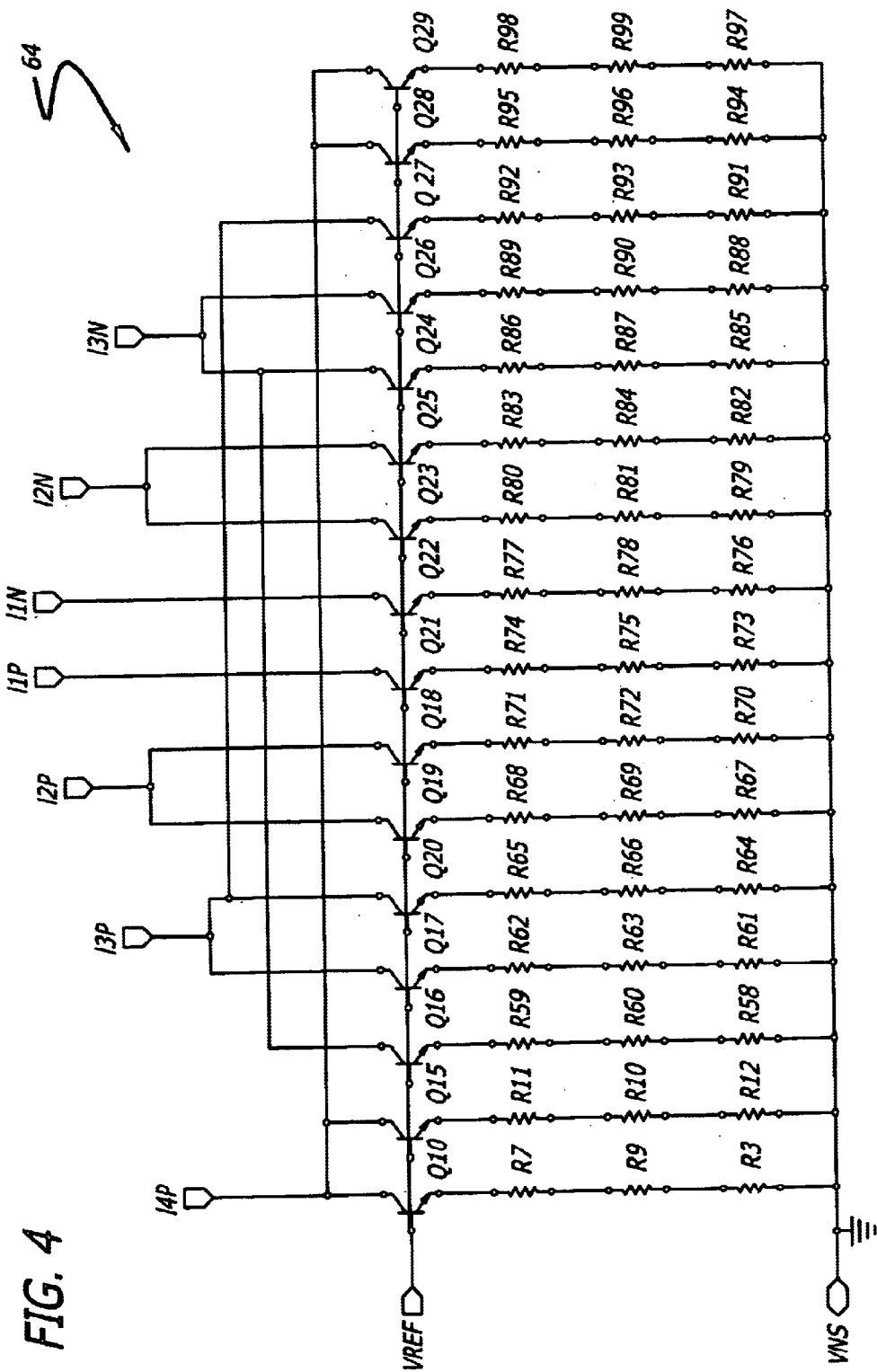
FIG. 4 is a diagram of an offset current source designed in accordance with the teachings of the present invention.

FIG. 4 is a diagram of an offset current source 64. Sixteen sets of 3 resistors in series connected to the emitter of a transistor are connected in parallel. The 16 sets are {R3, R9, R7, Q10}, {R12, R10, R11, Q15}, {R58, R60, R59, Q16}, {R61, R63, R62, Q17}, {R64, R66, R65, Q20}, {R67, R69, R68, Q19}, {R70, R72, R71, Q18}, {R73, R75, R74, Q21}, {R76, R78, R77, Q22}, {R79, R81, R80, Q23}, {R82, R84, R83, Q25}, {R85, R87, R86, Q24}, {R88, R90, R89, Q26}, {R91, R93, R92, Q27}, {R94, R96, R95, Q28}, and {R97, R99, R98, Q29}. The first resistor of each set is connected to VNS. The base of each transistor is connected to VREF. The collectors of transistors Q10, Q15, Q28, and Q29 are connected to I4P, producing a current +4I. The collectors of transistors Q17, Q20 and Q27 are connected to I3P, producing a current +3I. The collectors of transistors Q19 and Q18 are connected to I2P, producing a current +2I. The collector of transistor Q21 is connected to I1P, producing a current +I. The collector of transistor Q22 is connected to I1N, producing a current −I. The collectors of transistors Q23 and Q25 are connected to I2N, producing a current −2I. The collectors of transistors Q16, Q24 and Q26 are connected to I3N, producing a current −3I. In the preferred embodiment, the currents are really negative in value, but depending on which input they go to (IOSN, IOSP), they can create +/− offsets.

In addition to removing the R-C time constant associated with the resistive ladder of conventional ADCs, the active offset method of the present invention allows for the ability to easily trim individual thresholds without the need for trimmable resistors. For the ideal ADC, the $2^N-1$ thresholds are set at equally spaced quantization levels. In practice, however, there are non-linearities due to mismatches. These errors can be taken out using a novel linearity trim approach. Small trimmable currents are used across the load resistors R0 and R33 in the preamplifier 60 to move the zero crossing threshold in the output of the preamplifier.

Figure 5:
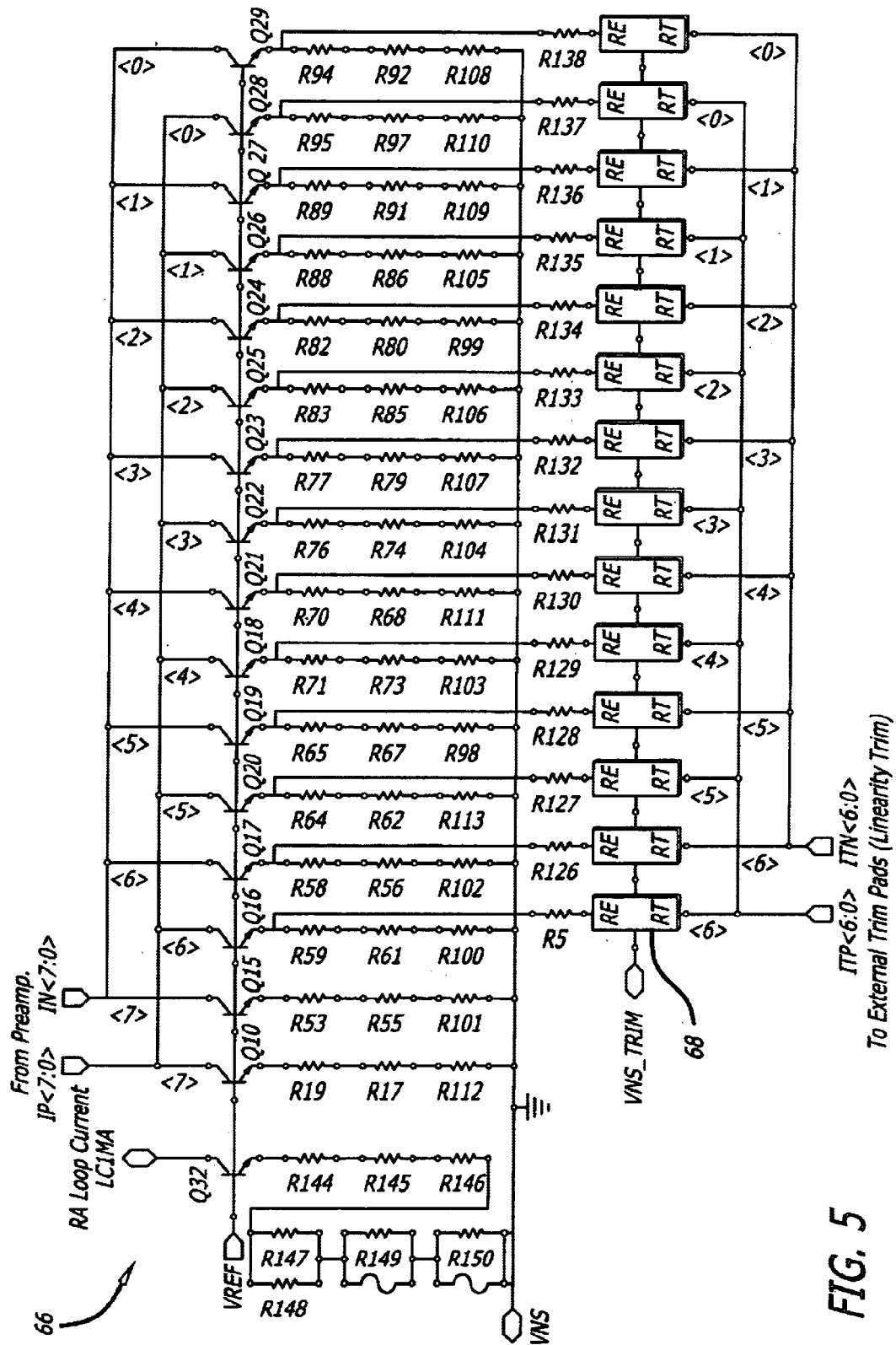
FIG. 5 shows an offset current source with linearity trim in accordance with the teachings of the present invention.

FIG. 5 shows an offset current source with linearity trim 66 in accordance with the teachings of the present invention. As shown in FIG. 5, each transistor in the offset current source 64 of FIG. 4 is connected at the emitter to an additional resistor and trim resistor circuit 68.

Figure 6:
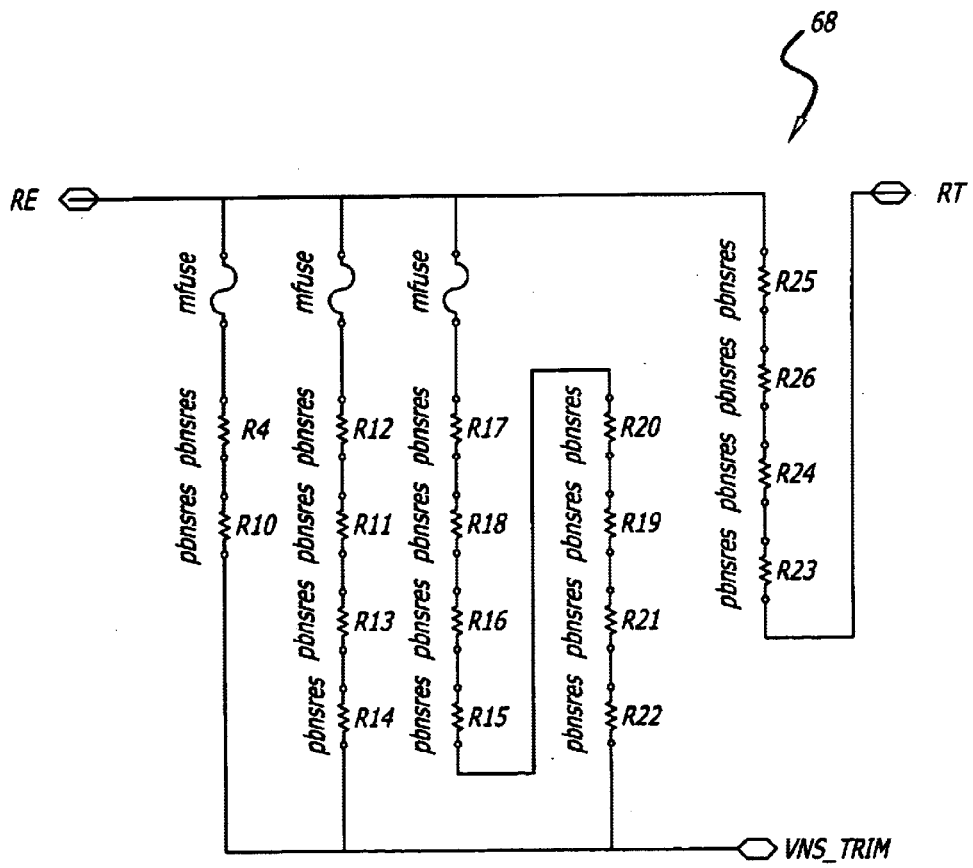
FIG. 6 shows a trim resistor circuit for the current source with linearity trim of FIG. 5.

FIG. 6 shows a trim resistor circuit 68. Four resistors in series {R25, R26, R24 and R23} are connected between RE and RT. Two resistors in series {R4 and R10} are connected in parallel with four resistors in series {R12, R11, R13, and R14} and eight resistors in series {R17, R18, R16, R15, R20, R19, R21, and R22} between RE and VNS_TRIM.

This small offset divided by the preamplifier gain effectively moves zero-crossing at the input to remove or minimize the non-linearity error. In this design, the reamp zero-crossing input error can be minimized by inducing an offset at the output of the preamplifier in the opposite direction from the input offset times the gain of the preamplifier. The trim current i is on both preamplifier load resistors R0 and R33 through cascode transistors Q41 and Q40. In this invention, the current i changes as the resistance changes when laser link fuses opened up.

This trim current can also be accomplished using resistors connected to CMOS switches in the current sources (a current DAC). These switches are addressed through a digital control interface that would allow digital calibration of the thresholds (as shown in FIG. 1). For either method, the change in i, delta i, multiplied by the preamplifier load resistor R creates a delta voltage offset at the preamplifier output which is referred back to the input to counter the input offset error.

The ADC of the present invention also includes a novel comparator architecture. The conversion rate of ADCs is limited by the acquisition and regeneration speed of the comparators. This novel comparator architecture improves upon previous architectures for improved speed performance.

Figures 1, 7:
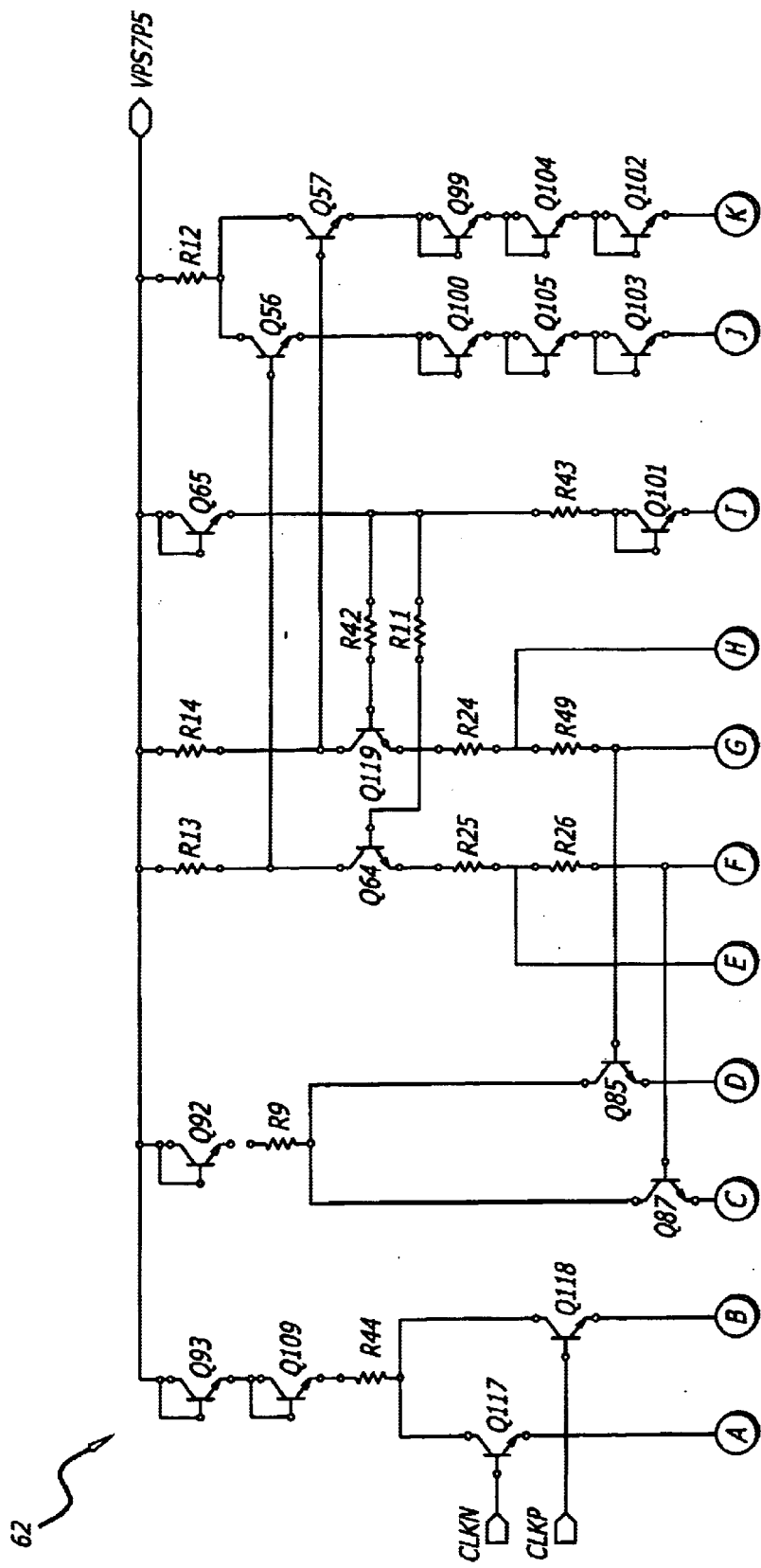
FIG. 7 shows a comparator designed in accordance with the teachings of the present invention.
Figures 2, 7:
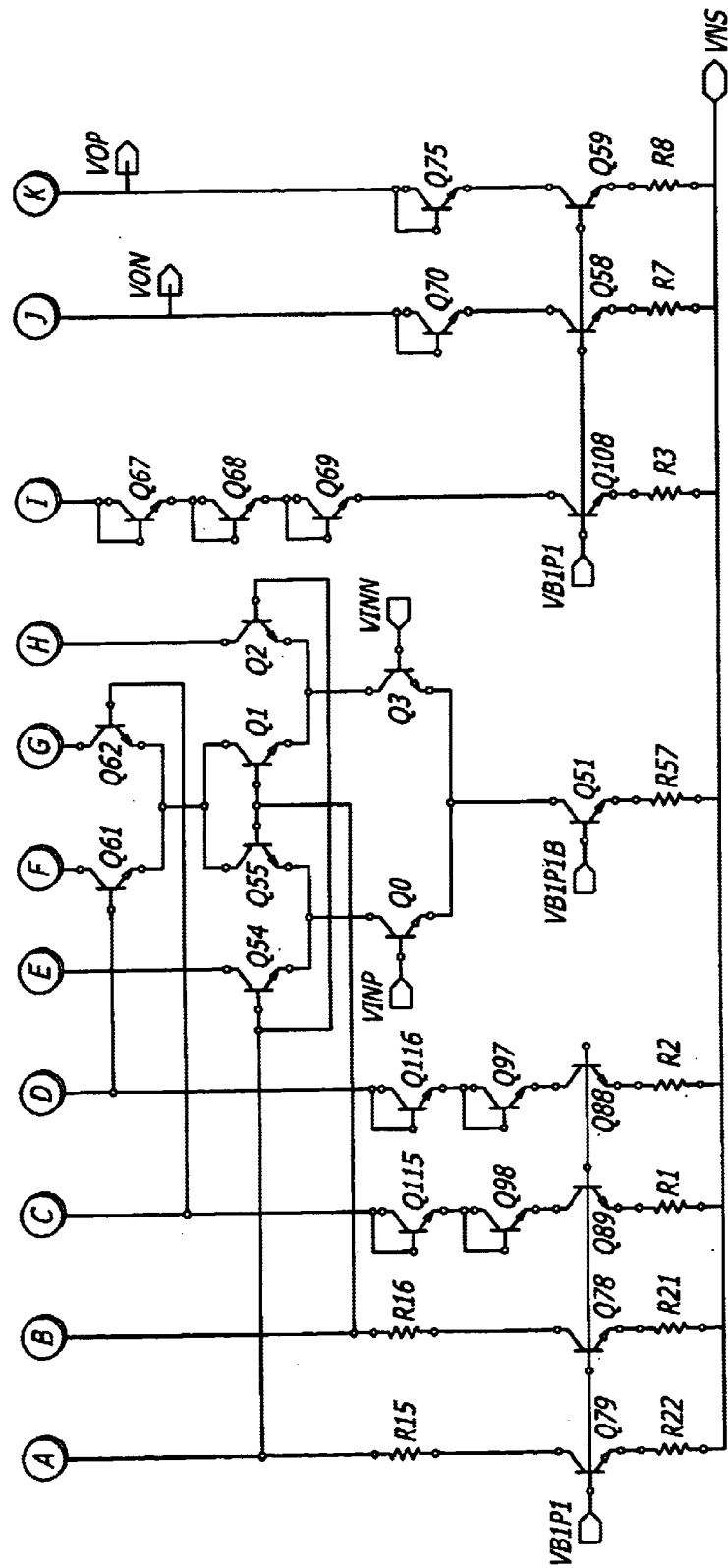

FIG. 7 shows a comparator 62 designed in accordance with the teachings of the present invention. The inputs VINP and VINN are connected to the bases of transistors Q0 and Q3, respectively. The emitters of Q0 and Q3 are connected to the collector of Q51. The base of Q51 is connected to VB1P1B, and the emitter is connected to VNS by resistor R57. The collector of Q0 is connected to the emitters of Q54 and Q55. The collector of Q3 is connected to the emitters of Q1 and Q2. The collectors of Q1 and Q55 are connected to the emitters of Q61 and Q62. The collector of Q61 is connected to the emitter of Q64 by R26 and R25 in series. The collector of Q62 is connected to the emitter of Q119 by R49 and R24 in series. The collectors of Q64 and Q119 are connected to VPS7P5 by R13 and R14, respectively. The collector of Q54 is connected between R26 and R25. The collector of Q2 is connected between R49 and R24.

The bases of Q54 and Q2 are connected to the emitter of Q117. The bases of Q55 and Q1 are connected to the emitter of Q118. The base of Q117 is connected to CLKN and the base of Q118 is connected to CLKP. The collectors of Q117 and Q118 are connected to the emitter of Q109 by R44. The base and collector of Q109 are connected to the emitter of Q93. The base and collector of Q93 are connected to VPS7P5. The emitter of Q117 is connected to the collector of Q79 by R15. The emitter of Q118 is connected to the collector of Q78 by R16. The emitter of Q79 is connected to VNS by R22. The emitter of Q78 is connected to VNS by R21.

The collector of Q61 is connected to the base of Q87. The collector of Q62 is connected to the base of Q85. The collectors of Q87 and Q85 are connected to the emitter of Q92 by R9. The base and collector of Q92 are connected to VPS7P5. The emitter of Q87 is connected to the base and collector of Q115. The emitter of Q85 is connected to the base and collector of Q116. The emitter of Q115 is connected to the base and collector of Q98. The emitter of Q116 is connected to the base and collector of Q97. The emitter of Q98 is connected to the collector of Q89. The emitter of Q97 is connected to the collector of Q86. The emitters of Q89 and Q86 are connected to VNS by R1 and R2, respectively. The bases of Q79, Q78, Q89, and Q86 are connected to VB1P1.

The bases of Q64 and Q119 are connected to the emitter of Q65 by R11 and R42, respectively. The base and collector of Q65 are connected to VPS7P5. The emitter of Q65 is connected to the base and collector of Q10 by R43. The emitter of Q101 is connected to the base and collector of Q67. The emitter of Q67 is connected to the base and collector of Q68. The emitter of Q68 is connected to the base and collector of Q69. The emitter of Q69 is connected to the collector of Q108. The emitter of Q108 is connected to VNS by R3.

The collector of Q64 is connected to the base of Q56. The collector of Q119 is connected to the base of Q57. The collectors of Q56 and Q57 are connected to VPS7P5 by R12. The emitter of Q56 is connected to the base and collector of Q100. The emitter of Q57 is connected to the base and collector of Q99. The emitter of Q100 is connected to the base and collector of Q105. The emitter of Q99 is connected to the base and collector of Q104. The emitter of Q105 is connected to the base and collector of Q103. The emitter of Q104 is connected to the base and collector of Q102. The emitter of Q103 is connected to VON and the base and collector of Q70. The emitter of Q102 is connected to VOP and the base and collector of Q75. The emitter of Q70 is connected to the collector of Q58. The emitter of Q75 is connected to the collector of Q59. The emitters of Q58 and Q59 are connected to VNS by R7 and R8, respectively. The bases of Q108, Q58, and Q59 are connected to VB1P1.

The comparator 62 has 3 features that enhance performance. The load resistors, pairs R25 (active mode) and R26 and pairs R24 (active mode) and R49 are split so during acquisition, the gain of Q0 and Q3 through cascodes Q54 and Q2 is reduced but bandwidth is increased to increase the acquisition time. During latch time, the gain is increased in latch pair Q61 and Q62 (R25 and R26 active and R24 and R49 active), to increase the regeneration speed (reduce the regeneration time constant). Another advantage is the addition of emitter follower buffers Q85 and Q87 on the latch pair Q61 and Q62 that reduces the capacitive loading on the regeneration node (collector of Q61 and Q62). Lastly, the output loading effects are eliminated from the regeneration node and taken out over cascodes Q64 and Q119. All of these improvements allow a faster acquisition time and regeneration time constant to be on the order of the forward transit time in the transistor, which is a theoretical limit.

The novel active offset trims and the improved comparator allow the ADC to operate in a given technology at higher input frequencies and still have the optimum clock rate and optimum performance.

The output of the 5-bit ADC 10 is a parallel data stream at 36 GS/s. This data stream represents the sampled RF and would normally be input to a high-speed signal processor. In the preferred embodiment, a programmable matched filter and decimation capability is included in the ADAM ASIC chip to help reduce the processing load and provide a realistic I/O (input/output) path.

Figure 8:
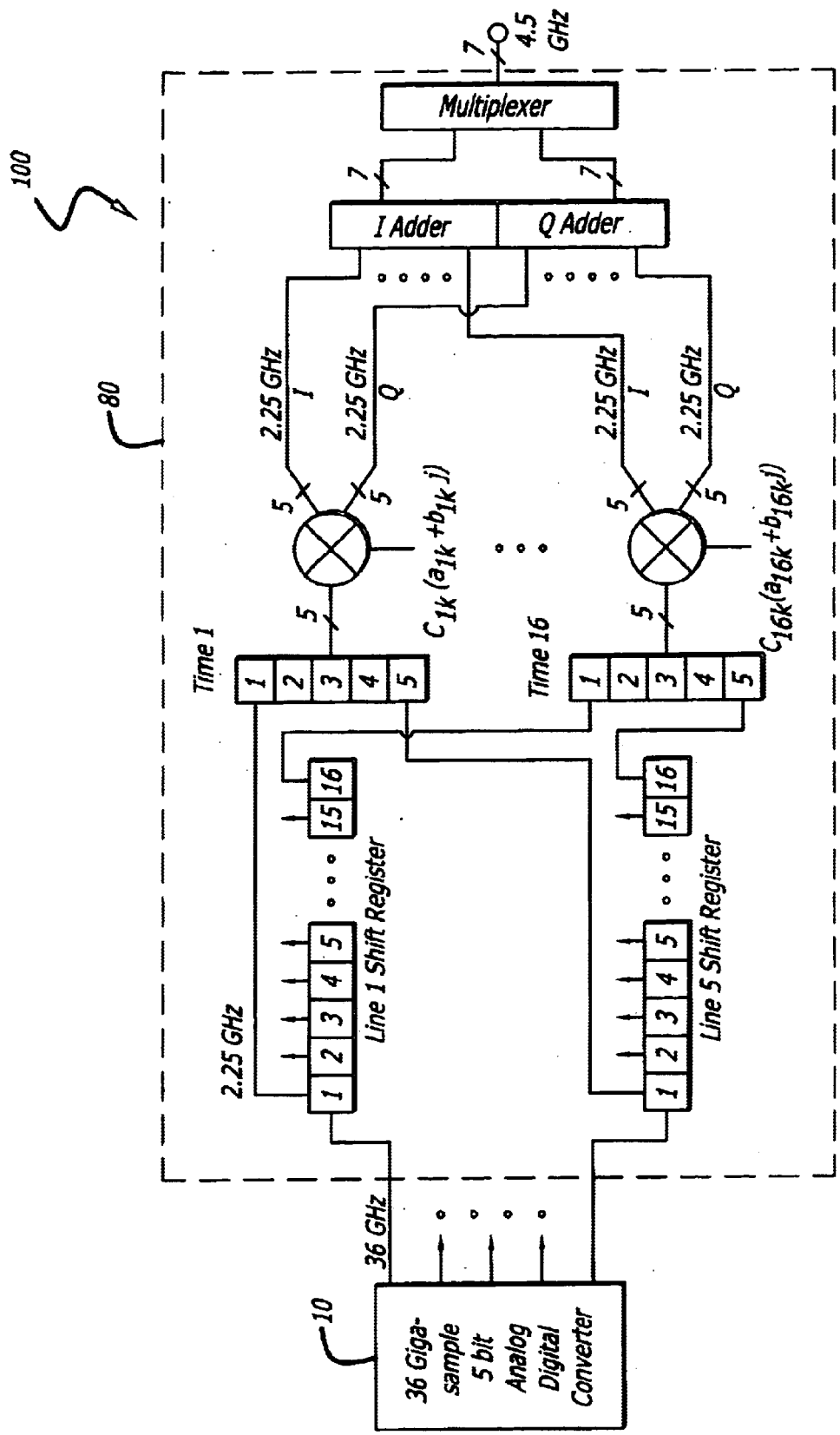
FIG. 8 shows the receiver section of the ADAM ASIC including the matched filter and decimation circuit.

FIG. 8 shows the receiver section 100 of the ADAM ASIC including the matched filter and decimation circuit 80. This provides a 5-bit data stream that is demultiplexed into time-series data words via a 16-bit shift register. Each bit within the register represents a sample time. Like sample times (1 through 16) are gathered into 16 5-bit registers that are then multiplied in a weighted complex phaser. This process provides the initial steps of a matched filtering/basebanding/FIR (Finite Impulse Response) filtering operation. The output of the multiply is a complex number represented by I (real) and Q (imaginary). By summing the I numbers and the Q numbers, the decimation/filtering is completed, and a complex word (7 bits real, 7 bits imaginary) is created representing one baseband sample. Both the real and imaginary portions of the word are multiplexed into a 4.5 GHz data stream to save pins.

Figure 9A:
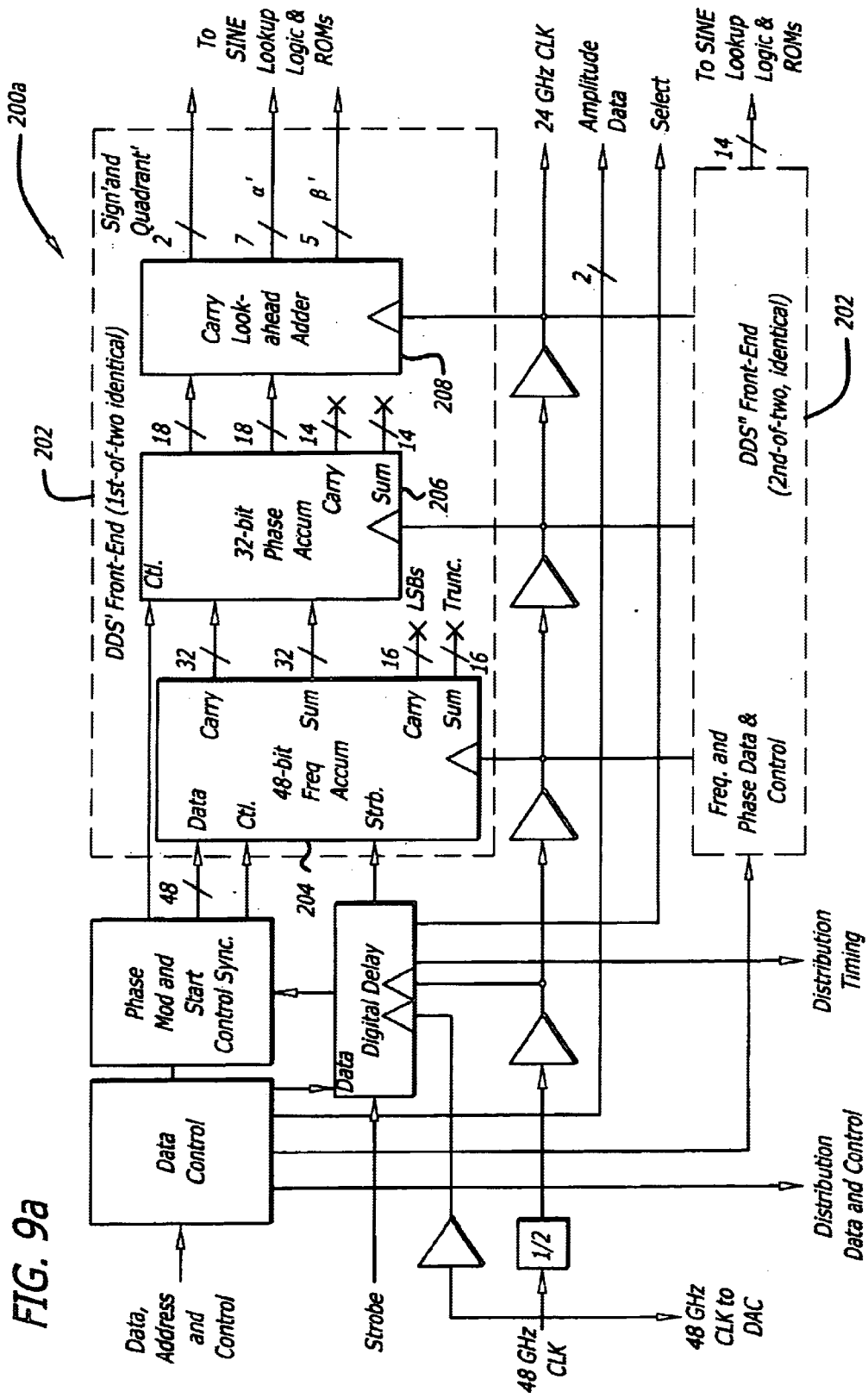
FIG. 9a shows the front end of a direct RF synthesized exciter subsection designed in accordance with the teachings of the present invention.
Figure 9B:
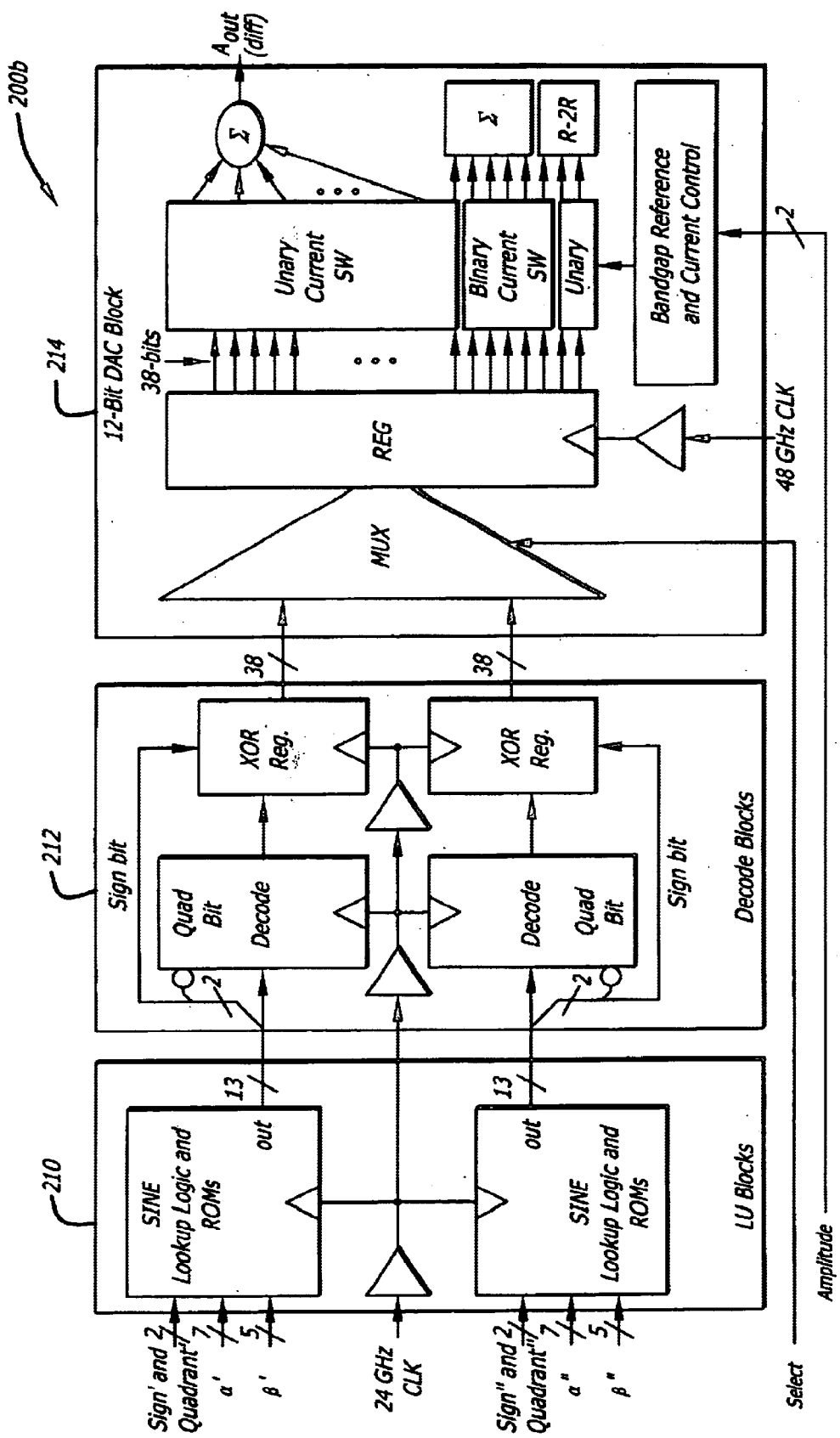
FIG. 9b shows the back end of a direct RF synthesized exciter subsection designed in accordance with the teachings of the present invention.

The direct RF synthesized exciter subsection 200 of the ADAM ASIC is characterized in FIG. 9. FIG. 9a shows the front end 200a of the direct RF synthesized exciter subsection, and FIG. 9b shows the back end 200b. The first function of the direct digital synthesizer (DDS) 202, the frequency accumulator 204, provides the initial integration required for the generation of frequency versus time from a ramp rate input. This is fed to the phase accumulator 206 which provides the second integration needed to generate phase and phase modulation (needed for Quadrature Phase Shift Keying {QPSK}, biphase modulation, etc.). The output of the phase accumulator 206 feeds the SINE lookup function 210. This function generates the sine wave points and feeds the decoding blocks 212, which translate these codes into digital signals for the digital-to-analog converter (DAC) 214 (phase to amplitude conversion). The carry/sum format for the frequency/phase accumulators (204, 206) also has the benefit of greatly reducing the digital circuitry needed to implement the function, resulting in lower power and smaller chip size. The carry/sum outputs are resolved in a carry look-ahead adder (CLA) 208.

In accordance with the teachings of the present invention, the DAC unary currents are trimmed in a fashion similar to the ADC described above. This trimming technique minimizes the DC differential and integral nonlinearities of the DAC.

The most challenging requirement in designing the ADAM DDS is how to achieve multi-GHz of bandwidth for direct digital synthesis while maintaining high spur-free dynamic range (SFDR). The dynamic nonlinearities of DACs in conventional DDSs limit their usable dynamic range at high conversion rates. Even with excellent DC linearity, self-heating of circuits and parasitics will limit the dynamic transient performance of high speed DACs, degrading their SFDR. The DDS approach of the present invention improves SFDR by using a novel sine lookup and decoder design described more fully in U.S. Patent Ser. No. 10/290,943 filed Nov. 8, 2002 entitled,"DIGITAL-PHASE TO DIGITAL AMPLITUDE TRANSLATOR WITH FIRST BIT OFF PRIORITY CODED OUTPUT FOR INPUT TO UNIT WEIGHTED DIGITAL TO ANALOG CONVERTER," to be filed, the teachings of which are incorporated herein by reference. The objective is to achieve nearly a bit-wise 50% duty cycle so that the self-heating and parasitic responses are nearly constant for each output cycle.

Figure 10:
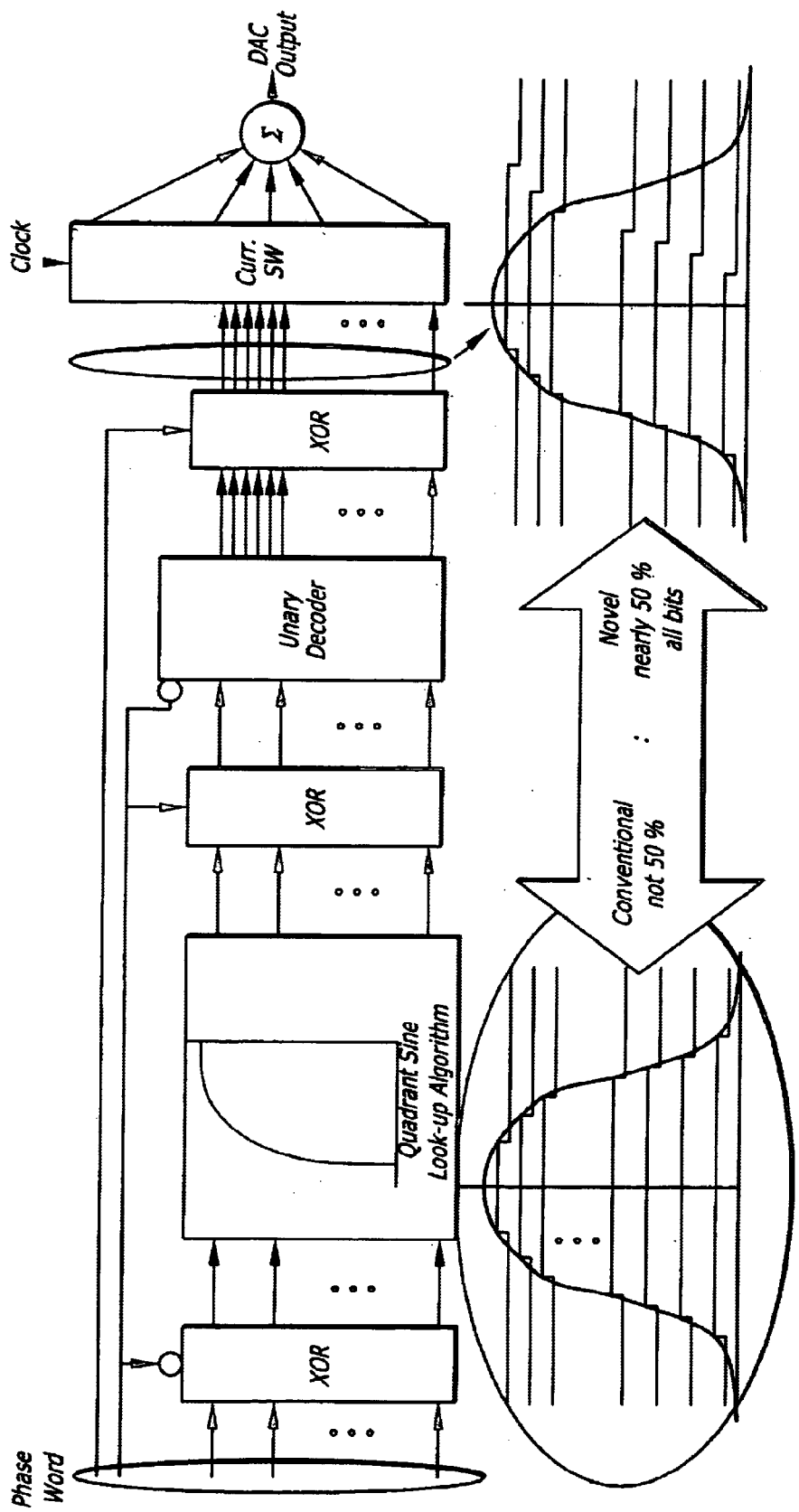
FIG. 10 illustrates the DDS sine look-up with a unary digital-to-analog converter.

FIG. 10 illustrates this design and supporting waveforms by overlaying the unary amplitude digital traces with the ideal DAC sine wave output. This digital solution for DAC distortion enables direct digital synthesis at X-Band with SFDR performance previously achievable only at L-Band.

While this approach is most effective for the unary current switches, high resolution DACs typically require segmentation to reduce the size of the decoder. The DAC of the present invention divides the converter's lower bits into binary and R-2R segments to minimize the RC time constants (improving the settling time and fidelity) of an otherwise long R-2R network. This settling time improvement further enables synthesis at X-Band with higher signal fidelity.

The digital complexity of the DDS is also a challenge for 12 bits of sine amplitude, 32 bits of phase data, and 48 bits of frequency data running at a 48 GHz clock rate (for synthesis at X-band). The complexity is minimized in part by an efficient Read Only Memory (ROM) sine lookup algorithm and a carry/sum format for single pipe accumulators, as discussed previously. The carry/sum outputs are resolved in a carry look-ahead adder (CLA).

In the preferred embodiment, two DDSs are time division multiplexed to produce the 48 GHz data stream to the DAC and develop RF up to 12 GHz. It will thus reduce risk by nearly doubling the allowable propagation delays. This architecture also provides a band select mode where one DDS is enabled and the other is disabled to reduce power when operating at frequencies between 0.2 and 9 GHz. Furthermore, to maintain an amplitude flatness of ±0.6 dB over the entire exciter range, an amplitude control of only 2 bits is required. These bits are static corrections for the inherent sine x-over-x roll off.

In the preferred embodiment, the ADAM ASIC receiver subsection has four independent receive channels. This is based upon several important technical reasons. First, both radar and communication systems require significantly more receive capability than transmit capability. For example, a reconnaissance radar system would typically require over eight independent channels to perform Electronic Counter Counter Measures (ECCM) cancellation, but require only one transmit channel. In addition, satellites requiring simultaneous multi-INT (i.e., radar, Signal Intelligence [SIGINT], Electro-Magnetic Intelligence [ELINT], communications) capability will require even more independent receive channels due to antenna/functional partitioning. Taking into account such factors as: (1) using the International Business Machines (IBM) Next Generation Transistor (NGT) process, (2) yield vs. die size considerations, (3) Hetero-Junction Bipolar Transistor (HBT) density, and (4) Bipolar CMOS (BiCMOS) gate density, four channels of receive were chosen to be incorporated within the ADAM ASIC.

Additionally, dynamic digital dithering can be utilized to de-correlate the quantization errors for both the ADC and the DAC. This dithering can be performed outside the bandwidth of interest, and does not impact the signal delays in the signal path. These dithering techniques are well known in the art. Through the process of dithering, large active antenna arrays can achieve, through processing gain, effective dynamic ranges that are several orders of magnitude improvement over the dynamic range of an individual antenna element.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. An analog-to-digital converter comprising:
   first means for receiving an input signal;
   second means for setting a predetermined number of thresholds wherein said second means includes a predetermined number of preamplifiers with weighted unit current sources in each of the preamplifier outputs; and
   third means for comparing said input signal to said thresholds.

2. The invention of claim 1 wherein said input is a differential input.

3. The invention of claim 1 wherein said third means includes a predetermined number of comparators connected to one preamplifier each.

4. The invention of claim 1 wherein said analog-to-digital converter further includes fourth means for trimming said thresholds.

5. The invention of claim 4 wherein said fourth means includes trimmable currents sources.

6. The invention of claim 4 wherein said fourth means includes a trimmable digital-to-analog converter.

7. The invention of claim 3 wherein said comparator includes:
   split load resistors, pairs R25 (active mode) and R26 and pairs R24 (active mode) and R49;
   latch pair transistors Q61 and Q62 connected to resistors R26 and R49, respectively;
   emitter follower buffers Q87 and Q85 on the latch pair transistors Q61 and Q62, respectively; and
   cascode transistors Q64 and Q119 connected to resistors R25 and R24, respectively.

8. The invention of claim 1 wherein said analog-to-digital converter further includes latches and error correction following said third means.

9. The invention of claim 1 wherein said analog-to-digital converter further includes a pipelined gray encoder following said third means.

10. The invention of claim 1 wherein said analog-to-digital converter operates at 36 GS/s.

11. The invention of claim 1 wherein said analog-to-digital converter is a 5-bit analog-to-digital converter.

12. A comparator circuit comprising:
    split load resistors, pairs R25 (active mode) and R26 and pairs R24 (active mode) and R49;
    latch pair transistors Q61 and Q62 connected to resistors R26 and R49, respectively;
    emitter follower buffers Q87 and Q85 on the latch pair transistors Q61 and Q62, respectively; and
    cascode transistors Q64 and Q119 connected to resistors R25 and R24, respectively.

13. A circuit comprising:
    a first predetermined number of receiver subsections, each receiver including an analog-to-digital converter comprising:
    a first circuit for receiving an input signal;
    a second circuit for setting a second predetermined number of thresholds wherein said second circuit includes a second predetermined number of preamplifiers with weighted unit current sources in each of the preamplifier outputs;
    a third circuit for comparing said input to said thresholds; and
    a fourth circuit for generating a digitally encoded signal based on the output of said third circuit; and
    at least one exciter subsection, wherein said receiver and exciter subsections are disposed on a common substrate.

14. The invention of claim 13 wherein said receiver further includes a matched filter and decimation circuit following said fourth circuit.

15. The invention of claim 13 wherein said fourth circuit is a pipelined gray encoder.

16. The invention of claim 13 wherein said analog-to-digital converter further includes a fifth circuit for trimming said thresholds.

17. The invention of claim 16 wherein said fifth circuit includes a trimmable digital-to-analog converter.

18. The invention of claim 13 wherein said receiver further includes a latches and error correction circuit following said third circuit.

19. The invention of claim 13 wherein said third circuit includes a second predetermined number of comparators connected to one preamplifier each.

20. The invention of claim 19 wherein said comparator includes split load resistors, pairs R25 (active mode) and R26 and pairs R24 (active mode) and R49;

latch pair transistors Q61 and Q62 connected to resistors R26 and R49, respectively;

emitter follower buffers Q87 and Q85 on the latch pair transistors Q61 and Q62, respectively; and cascode transistors Q64 and Q119 connected to resistors R25 and R24, respectively.

21. The invention of claim 13 wherein said analog-to-digital converter operates at 36 GS/s.

22. The invention of claim 13 wherein said analog-to-digital converter is a 5-bit analog-to-digital converter.

23. The invention of claim 13 wherein said exciter subsection includes at least one direct digital synthesizer and a digital-to-analog converter.

24. The invention of claim 23 wherein said direct digital synthesizer includes:

a frequency accumulator;

a phase accumulator following said frequency accumulator;

a sine lookup algorithm following the phase accumulator; and a decoder following the sine lookup algorithm.

25. The invention of claim 24 wherein said frequency and phase accumulators have a carry/sum format.

26. The invention of claim 25 wherein said direct digital synthesizer further includes a carry look-ahead adder following said phase accumulator.

27. The invention of claim 23 wherein said exciter subsection includes two time division multiplexed direct digital synthesizers.

28. The invention of claim 27 wherein said exciter subsection further includes means for enabling one direct digital synthesizer and disabling the other to reduce power.

29. The invention of claim 23 wherein said digital-to-analog converter includes trimmable unary currents.

30. The invention of claim 23 wherein said digital-to-analog converter's lower bits are divided into binary and R-2R segments to minimize the RC time constants.

31. The invention of claim 23 wherein said digital-to-analog converter operates at 48 GHz.

32. The invention of claim 13 wherein said first predetermined number is four.

33. A method for digitizing an analog signal including the steps of:

receiving an input signal;

setting a predetermined number of thresholds using a predetermined number of preamplifiers with weighted unit current sources in each of the preamplifier outputs;

comparing said input to said thresholds; and generating a digitally encoded signal based on said comparisons.

* * * * *